(12) United States Patent
Nakamura et al.

(10) Patent No.: US 7,781,760 B2
(45) Date of Patent: Aug. 24, 2010

(54) THIN FILM TRANSISTOR, ELECTRO-OPTICAL DEVICE, AND ELECTRONIC APPARATUS

(75) Inventors: Kiyoshi Nakamura, Chino (JP); Hirofumi Hokari, Chino (JP); Kazuya Nakamura, Tatsuno-machi (JP)

(73) Assignee: Seiko Epson Corporation, Tokyo (JP)

( * ) Notice: Subject to any disclaimer, the term of this patent is extended or adjusted under 35 U.S.C. 154(b) by 205 days.

(21) Appl. No.: 11/901,676

(22) Filed: Sep. 18, 2007

(65) Prior Publication Data

US 2008/0169462 A1 Jul. 17, 2008

(30) Foreign Application Priority Data

Sep. 26, 2006 (JP) ............................. 2006-260029
Oct. 6, 2006 (JP) ............................. 2006-274819
Jul. 4, 2007 (JP) ............................. 2007-175810

(51) Int. Cl.
*H01L 29/08* (2006.01)
*H01L 47/00* (2006.01)

(52) U.S. Cl. ....................... 257/40; 257/4; 257/E21.024

(58) Field of Classification Search .......... 257/E29.111, 257/E29.112, E29.116, E29.118, 40, 72, 257/213, 365, 75, E29.122, E29.143, E29.151, 257/E21.011, E21.036, E21.024; 564/435
See application file for complete search history.

(56) References Cited

U.S. PATENT DOCUMENTS

| 5,528,056 | A | * | 6/1996 | Shimada et al. ................ 257/72 |
| 5,741,728 | A | * | 4/1998 | Kim ............................ 438/75 |
| 5,981,983 | A | * | 11/1999 | Funaki et al. ................ 257/138 |
| 6,028,580 | A | * | 2/2000 | Kosegawa et al. .............. 345/98 |
| 6,259,142 | B1 | * | 7/2001 | Dawson et al. ............... 257/365 |
| 6,426,517 | B2 | * | 7/2002 | Hayakawa et al. ............. 257/72 |
| 2002/0128515 | A1 | * | 9/2002 | Ishida et al. ................. 564/435 |
| 2005/0173701 | A1 | * | 8/2005 | Kawase et al. ................ 257/40 |
| 2005/0269601 | A1 | * | 12/2005 | Tsubaki ...................... 257/213 |
| 2007/0278492 | A1 | * | 12/2007 | Song et al. .................... 257/72 |

FOREIGN PATENT DOCUMENTS

| JP | 62-042563 A | 2/1987 |
| JP | 08-279616 A | 10/1996 |
| JP | 2005-223286 A | 8/2005 |

* cited by examiner

*Primary Examiner*—Lynne A Gurley
*Assistant Examiner*—Galina Yushina
(74) *Attorney, Agent, or Firm*—AdvantEdge Law Group, LLC

(57) ABSTRACT

A thin film transistor includes a source electrode and a drain electrode which are disposed to face each other, an organic semiconductor layer provided at least between the source electrode and the drain electrode, a plurality of gate lines extending over the source electrode, the organic semiconductor layer, and the drain electrode, and a gate insulating layer interposed between the source electrode, the drain electrode, and the organic semiconductor layer and the plurality of gate lines.

8 Claims, 10 Drawing Sheets

THIN FILM TRANSISTOR, ELECTRO-OPTICAL DEVICE, AND ELECTRONIC APPARATUS

BACKGROUND

1. Technical Field

The present invention relates to a thin film transistor, more particularly, to a thin film transistor using an organic semiconductor layer, and an electro-optical device and an electronic apparatus which have the thin film transistor.

2. Related Art

Since delicate circuits of organic thin film transistors can be produced by using a simple process in which, for example, circuits are mixed with solvents for being printed, which is different from known transistor producing methods, the organic thin film transistors have excellent advantages in view of facilitating mass-production and increasing in areas thereof at low cost. Furthermore, since the organic thin film transistors can be produced on flexible substrates, they are expected to be used for electronic paper or the like (see JP-A-2005-223286).

In the organic thin film transistors, bulk resistance thereof decreases due to a minute amount of remaining oxygen when application of voltage is repeated, whereby the ON/OFF state thereof deteriorates, and finally there is a possibility that modulation is not performed in a gate thereof.

In other words, there is a problem that characteristics of the organic thin film transistors change in accordance with repetition of voltage application so as to have insufficient reliability, that is, the organic thin film transistors has low durability.

SUMMARY

An advantage of some aspects of the invention is that it provides a thin film transistor having high reliability and an electro-optical device and an electronic apparatus which have the thin film transistor.

According to a first aspect of the invention, a thin film transistor includes: a source electrode and a drain electrode which are disposed to face each other; an organic semiconductor layer provided at least between the source electrode and the drain electrode; a plurality of gate lines extending over the source electrode, the organic semiconductor layer, and the drain electrode; and a gate insulating layer interposed between the source electrode, the drain electrode, and the organic semiconductor layer and the plurality of gate lines.

Since the thin film transistor has the plurality of gate lines, when a predetermined voltage value is applied to the gate lines, independent channels are induced in portions of the organic semiconductor layer which are overlapped with the gate lines. Thus, in a case where one gate line is continuously used to deteriorate the ON/OFF characteristics of one transistor, a normal operation of the thin film transistor which has a characteristic close to an initial characteristic thereof can be performed by switching to another gate line. In addition, a unit driving time for each gate line can be decreased by sequentially applying driving pulses to the plurality of the gate lines, and thereby the deterioration of the characteristic of the organic semiconductor layer can be suppressed.

Preferably, in the thin film transistor, a plurality of the source electrodes and a plurality of the drain electrodes may be disposed alternately along an extending direction of the plurality of gate lines, and the plurality of gate lines may intersect the plurality of the source electrodes and the plurality of drain electrodes. Accordingly, when a predetermined voltage value is applied to the gate lines, a plurality of short channels are induced along the extending direction of the gate lines. By forming a plurality of channels having short channel lengths, the driving current of the thin film transistor can be increased.

The source electrode and the drain electrode may be formed in a comb-teeth-like shape. In such a case, a plurality of channels having short channel lengths can be formed, and thereby the driving current of the thin film transistor can be increased.

The gaps between the source electrode and the drain electrode in portions in which the plurality of gate lines are overlapped with the source electrode and the drain electrode for each one of the plurality of gate lines may be different from each other. In such a case, when a voltage equal to or greater than a threshold value is applied to the gate line, a channel is induced in a portion of the semiconductor layer which is overlapped with the gate line, and thereby a driving current flows between the source electrode and the drain electrode. The driving current depends on the channel length, that is, a gap between the source electrode and the drain electrode. In particular, as the gap between the source electrode and the drain electrode decreases, the driving current increases. Accordingly, in the thin film transistor, it is possible to control the driving current by selecting a gate line without changing the gate voltage value.

At least one of the source electrode and the drain electrode may be formed in a taper-like or a step-like plane shape. In such a case, the gaps between the source electrode and the drain electrode for the gate lines can be formed to be different from each other.

Preferably, widths of the plurality of gate lines may be different for each gate line. In such a case, when a voltage equal to or greater than a threshold value is applied to the gate line, a channel is induced in a portion of the semiconductor layer which is overlapped with the gate line, and thereby a driving current flows between the source electrode and the drain electrode. The driving current depends on the channel width, that is, the width of the gate line. In particular, as the width of the gate line increases, the driving current increases. Accordingly, in the thin film transistor, it is possible to control the driving current by selecting a gate line without changing the gate voltage value.

According to a second aspect of the invention, there is provided an electro-optical device having the thin film transistor. Accordingly, the whole defect of the electro-optical device due to deterioration of the characteristic of the thin film transistor can be prevented, and thereby an electro-optical device having high reliability can be implemented.

According to a third aspect of the invention, there is provided an electronic apparatus having the electro-optical device. Accordingly, the whole defect of the electronic apparatus due to deterioration of the characteristic of the thin film transistor can be prevented, and thereby an electronic apparatus having high reliability can be implemented.

According to some aspects of the present invention, a thin film transistor having high reliability and an electro-optical device and an electronic apparatus which have the thin film transistor can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

First, a structure of a thin film transistor according to an embodiment of the present invention will be described.

Figure 1:
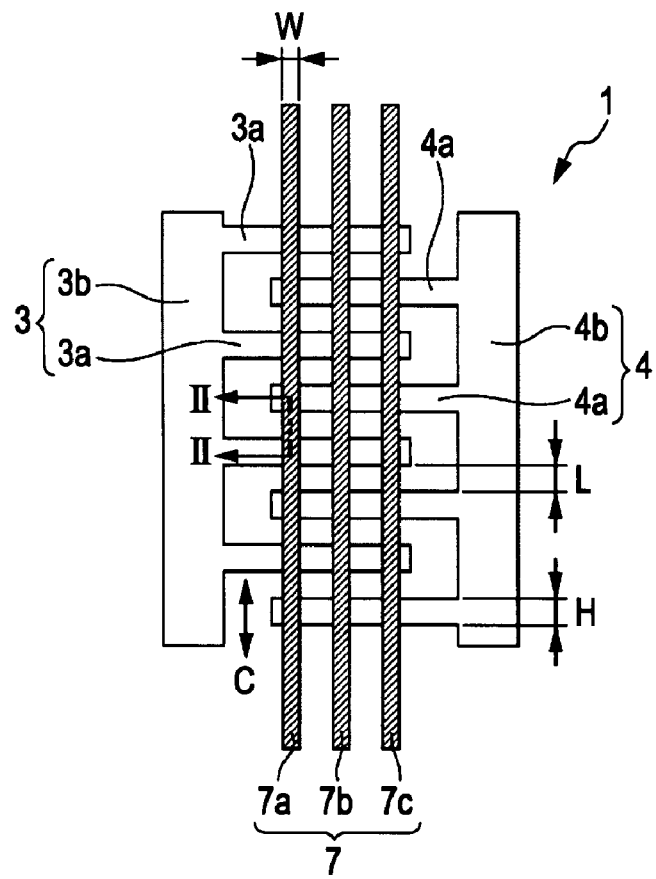
FIG. 1 is a plan view of a thin film transistor according to a first embodiment of the present invention.
Figure 2:
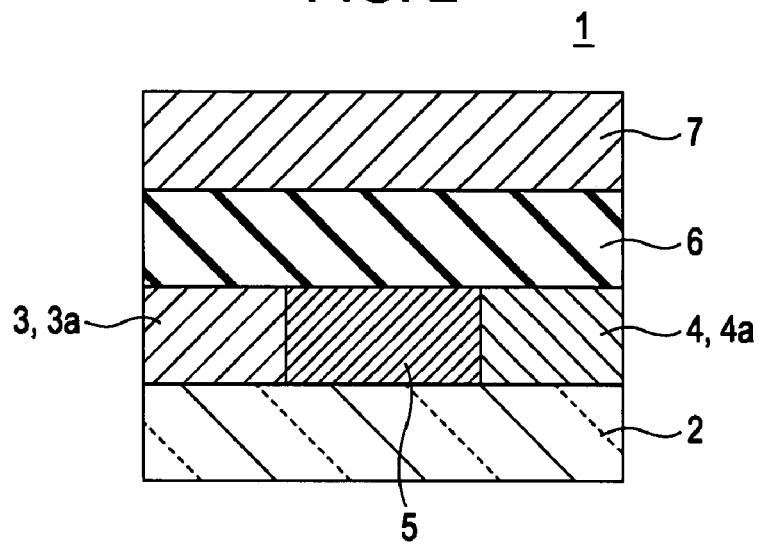
FIG. 2 is a sectional view of a thin film transistor according to the first embodiment of the invention.

FIG. 1 is a plan view of a thin film transistor according to an embodiment of the invention. FIG. 2 is a sectional view of FIG. 1 taken along line A-A'.

As shown in FIG. 2, the thin film transistor 1 includes a source electrode 3 and a drain electrode 4 which are formed on a substrate 2, an organic semiconductor layer 5 that is provided at least between the source electrode 3 and the drain electrode 4, an insulating layer 6 formed on the organic semiconductor layer 5, and gate lines 7 formed on the insulating layer 6.

As shown in FIG. 1, the thin film transistor 1 has a plurality of gate lines 7, which is a feature of this embodiment. In FIG. 1, a case where three gate lines 7a, 7b, and 7c are disposed is shown. When each one of the gate lines 7a, 7b, and 7c is not required to be identified, it will be simply referred to as a gate line 7. Both of the source and drain electrodes 3 and 4 are formed in a comb-teeth-like shape.

Electrode portions 3a and 4a of the source and drain electrodes 3 and 4 are alternately arranged along a channel length L direction and spaced apart from each other by a predetermined distance. In the organic semiconductor layer 5 of the thin film transistor 1, areas between the electrode portions 3a of the source electrode 3 and the electrode portions 4a of the drain electrode 4 become channels through which carriers move. There are seven channel areas for each one of the gate lines 7a, 7b, and 7c. In other words, the number of the channels for each gate line is seven. The number of the channels is not limited to seven but may be two or more. Lengths of areas between the electrode portions 3a of the source electrode 3 and the electrode portions 4a of the drain electrode 4 in a moving direction of carriers, that is, distances between the electrode portions 3a and 4a correspond to a channel length L. A width of the gate line 7 corresponds to an approximate width W. The electrode portions 3a or 4a are connected to each other with a connection portion 3b or 4b.

The thin film transistor 1 has a structure in which the organic semiconductor layer 5 is disposed on a substrate 2 side relative to the gate line 7, that is, a top-gate structure.

Hereinafter constituent portions of the thin film transistor 1 will be described one by one.

The substrate 2 serves to support other layers (parts) constituting the thin film transistor 1. As the substrate 2, for example, a glass substrate, a plastic substrate (resin substrate) made of a polyimide (PI), polyethylene terephthalate (PET), polyethylene naphthalate (PEN), poly methyl methacrylate (PMMA), polycarbonate (PC), polyethersulfone (PES), an aromatic polyester (liquid crystal polymer), or the like, a quartz substrate, a silicon substrate, or a gallium arsenide substrate may be used. When flexibility is to be imparted to the thin-film transistor 1, a resin substrate is selected as the substrate 2.

An underlying layer may be formed on the substrate 2. The underlying layer serves to prevent ions from being diffused from the surface of the substrate 2 and also serves to improve the adhesion (connectivity) between the source and drain electrodes 3 and 4 and the substrate 2. Although there is no particular restriction on the material of the underlying layer, silicon oxide ($SiO_2$) or silicon nitride (SiN), polyimide, a polymer insolubilized by cross-linking, or the like is preferably used.

The materials of the source and drain electrodes 3 and 4 are not particularly limited, and an example of the materials is a conductive material such as Pd, Pt, Au, W, Ta, Mo, Al, Cr, Ti, or Cu, an alloy of two or more of such conductive materials, a conductive oxide material such as ITO, FTO, ATO, $SnO_2$, a carbon material such as carbon black, carbon nanotube, or fullerene, polythiophene such as polyacetylene, polypyrrole, or PEDOT (polyethylenedioxythiophene), a conductive polymer material such as polyaniline, poly(p-phenylene), polyfluorene, polycarbazole or polysilane, or a derivative thereof. Such materials may be used individually, or two or more of the materials may be used in combination. When the conductive polymer material is used, it is doped with a polymer such as an iron oxide, iodine, an inorganic acid, an organic acid, and a polystyrene sulfuric acid, and conductivity is imparted thereto. Among such materials, Ni, Cu, Co, Au, or Pd or an alloy thereof is preferably used as the main material of the source and drain electrodes 3 and 4.

Although there is no particular restriction on the thickness (average thickness) of the source and gate electrodes 3 and 4, the thickness thereof is preferably in the range of 30 to 300 nm, and more preferably in the range of 50 to 150 nm. A width H of each electrode portion 3a or 4a is preferably equal to or less than 20 μm, and is more preferably in the range from several μm to 10 μm. A length of each electrode portion 3a or 4a, for example, is equal to or more than several tens of μm.

The distance (gap distance) between the source and drain electrode portions 3a and 4a, that is, the channel length L is preferably set to be in the range of 2 to 20 μm, and is more preferably set to be in the range of 3 to 10 μm. As the channel length L decreases, a relatively large driving current (drain current) can be controlled and capacity of the gate line can be decreased. However, when the channel length L is set to be lower than the above-described lower limit, high-precision photolithography is required for electrode patterning, which results in an increase in production cost. In addition, there are cases where expected advantages cannot be acquired due to contact resistance between the source electrode and the organic semiconductor layer, even when a short channel length is attained. On the other hand, when the channel length L is set to be higher than the upper limit, a value of the driving current decreases, which may result in a characteristic of the thin film transistor 1 being insufficient.

Preferably, a gate width W is set to be in the range of several μm to several tens of μm. When the channel width W is lower than the lower limit, a value of the drain current decreases, which may result in a characteristic of the thin film transistor 1 being insufficient. The upper limit of the channel width W depends on the number of the gates.

The organic semiconductor layer 5 is mainly formed of an organic semiconductor material (organic material behaving as a semiconductor in electrical conduction). Preferably, at least the channel area (an area overlapping the gate) of the organic semiconductor layer 5 is aligned substantially parallel to the channel direction C. Accordingly, the mobility of carriers in the channel area becomes high, whereby the operation speed of the thin film transistor 1 increases.

As a low-molecular-weight organic semiconductor material, a low-molecular-weight organic semiconductor material such as naphthalene, anthracene, tetracene, pentacene, hexacene, phthalocyanine, perylene hydrazone, triphenylmethane, diphenyl methane, stilbene, arylvinyl pyrazoline, triphenylamine, triarylamine, oligothiophene, or phthalocyanine or a derivative thereof or a high-molecular-weight organic polymer semiconductor material (conjugated polymer material) such as poly-N-vinylcarbazol, polyvinyl pyrene, polyvinylanthracene, polythiophene, polyhexylthiophene, poly(p-phenylenevinylene), polytynylenevinylene, poly-allylamine, a pyrene formaldehyde resin, an ethylcarbazole formaldehyde resin, a fluorene-bithiophene copolymer, or a fluorene-allylamine copolymer or a derivative thereof may be used. Such organic semiconductor materials may be used alone or any combination of two or more such organic semiconductor materials may be used. However, it is preferable to mainly use the high-molecular-weight organic semiconductor materials (conjugated polymer material). The conjugated polymer materials have a high mobility of carriers due to their unique electron cloud spreading. The high-molecular-weight organic semiconductor material can be formed as a film in an easy manner and can be aligned relatively easily.

Of those materials, the organic semiconductor material includes as a main ingredient at least one among a copolymer such as a fluorene-bithiophene copolymer which contains fluorine and bithiophene, a polymer such as poly-allylamine or a fluorene-allylamine copolymer which contains allylamine, and derivatives thereof, more preferably. The organic semiconductor material preferably includes at least one among poly-allylamine, a fluorene-bithiophene copolymer, and derivatives thereof as a main ingredient. Since the organic semiconductor layer 5 formed of such an organic semiconductor material has high water resistance and high oxidation resistance even when being temporally exposed in a high-temperature and high-humidity environment, deterioration of quality thereof is prevented, whereby the organic semiconductor layer 5 can be chemically stable.

The organic semiconductor layer 5 that is mainly made of an organic semiconductor material can be made thin and light and has excellent flexibility, and accordingly, it is appropriate to be used in a thin film transistor used as a switching element of a flexible display or the like. The depth (average) of the organic semiconductor layer 5 is preferably in the range of 0.1 to 1000 nm, is more preferably in the range of 10 to 500 nm, and is further more preferably in the range of 10 to 100 nm.

The gate insulating layer 6 serves to insulate the gate line 7 from the source and drain electrodes 3 and 4. It is preferable that the gate insulating layer 6 is mainly made of an organic material (particularly, an organic polymer material). The gate insulating layer 6 that is mainly made of the organic polymer material can be formed in an easy manner, and adhesiveness between the organic semiconductor layer 5 and the gate insulating layer 6 can be improved. As the organic polymer material, for example, an acrylic resin such as a polystyrene resin, a polyimide resin, a polyamide-imide resin, polyvinylphenylene resin, a polycarbonate (PC) resin, and a poly methyl methacrylate resin, a halogenated resin such as a polytetrafluoroethylene (PTFE) resin, a phenolic resin such as a polyvinylphenol resin or a novolac resin, and an olefinic resin such as a polyethylene resin, a polypropylene resin, a polyisobutylene resin, or a polybutene resin may be used. Among such materials, one may be used, or a combination of two or more materials may be used.

Although the depth (average) of the gate insulating layer 6 is not particularly limited, it is preferably in the range of about 10 to 5000 nm, and is more preferably in the range of about 100 to 1000 nm. By setting the depth of the gate insulating layer 6 in the above-described range, increase in the size (particularly, increase in thickness) of the thin film transistor 1 can be prevented while insulation between the source and drain electrodes 3 and 4 and the gate line 7 can be assuredly made.

The structure of the gate insulating layer 6 is not limited to a single layer and may be laminated as multiple layers. As the material of the gate insulating layer 6, for example, an inorganic insulating material such as $SiO_2$ can be used. In such a case, $SiO_2$ used for the gate insulating layer 6 can be acquired by coating a solution such as silicate, polysiloxane, or polysilazane to form a coated film and heating the coated film in the presence of oxygen or vapor. Alternatively, the inorganic insulating material can be acquired (as known as a Sol-gel method) by coating a metal alkoxide solution and heating the coating in oxygen ambient.

The material of the gate line 7 may be a conductive material such as a metal material or a metal oxide material such as Ag, Pd, Pt, Au, W, Ta, Mo, Al, Cr, Ti, Cu, or Ni, an alloy thereof, indium tin oxide (ITO), indium oxide (IO), indium zinc oxide (IZO), antimony tin oxide (ATO), and tin oxide ($SnO_2$). Among such materials, one may be used alone, or a combination of two or more materials may be used. Moreover, as the conductive material, for example, the conductive polymer material for the source and drain electrodes 3 and 4 described above can be used.

Among such materials, it is preferable that the material of the gate line is mainly made of at least one of Au, Ag, Cu, Pt, Pd, or Ni or an alloy thereof. Such materials are preferable, since they have high conductivity.

In the thin-film transistor 1, the current flowing between the source electrode 3 and the drain electrode 4 is controlled by controlling the voltage applied to the gate line 7. In other words, when the thin film transistor 1 is in an OFF state in which no voltage is applied to the gate line 7, there is substantially no carrier in the organic semiconductor layer 5, and thus substantially no current flows even if a voltage is applied between the source electrode 3 (source electrode portion 3a) and the drain electrode 4 (drain electrode portion 4a). On the other hand, when the thin film transistor 1 is in an On state in which a voltage is applied to the gate line 7, carriers are induced in a portion of the organic semiconductor layer 5 which contacts the gate insulating layer 6, and a channel is formed. In this state, if a voltage is applied between the source electrode 3 and the drain electrode 4, a current flows through the channel.

In this embodiment, although a structure in which both of the source electrode 3 and the drain electrode 4 are formed in comb-teeth-like shapes and comb-teeth portions thereof are arranged alternately has been described, however, the shapes of the source and drain electrodes 3 and 4 are not limited thereto.

Method of Producing Thin Film Transistor

FIGS. 3A to 3D are sectional views of the thin film transistor 1 for each production process for illustrating a method of producing thereof.

Figure 3A:
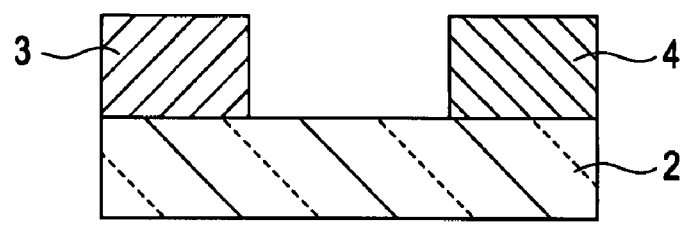
FIGS. 3A to 3D are sectional views of the thin film transistor according to the first embodiment of the invention for each production process.

As shown in FIG. 3A, the source electrode 3 and the drain electrode 4 are formed by forming a metal film on the substrate 2 and patterning the metal film.

The metal film can be formed by, for example, chemical vapor deposition (CVD) such as plasma CVD, thermal CVD, or laser CVD, a dry plating process such as vacuum evaporation, sputtering, or ion plating, a wet plating process such as electroplating, immersion plating, or electroless plating, thermal spraying, a sol-gel method, or a metal organic deposition (MOD) method. It is preferable to form the metal film by using an electroless plating process. By using the electrolytic plating process, the source and drain electrodes 3 and 4 formed with a high precision can be formed at low cost in an easy manner without using a large-scale apparatus such as a vacuum apparatus. When a resin substrate such as polyimide is used as the substrate 2, it is preferable to form the adhesion layer before performing the metal film forming process so as to improve adhesiveness of the metal film to the substrate 2.

The patterning process is performed by forming a resist mask on the metal film using lithography technology and then etching the metal film using the resist mask. This etching process may be performed by using one or combining two or more physical etching methods such as plasma etching, reactive etching, beam etching, or photo-assisted etching, chemical etching such as wet etching, or the like. Of those etching processes, it is preferable to use the wet etching. Accordingly, the etching process can be performed by using a simple apparatus and a simple process without using a large-scale apparatus such as a vacuum apparatus. As an etching solution used in the wet etching process, for example, a solution containing ferric chloride, a solution containing sulfuric acid, nitric acid, or acetic acid, or the like can be used. Then, the resist mask is removed. For the removal of the resist mask, it is preferable to use a resist peeling solution. However, for example, the above-described physical etching process may be used for the removal of the resist mask.

As described above, by combining the photo lithography method and the etching process, it is possible to assuredly form the source and drain electrodes 3 and 4 with high dimensional precision in an easy manner. Thus, it becomes possible to set the width H of the source and drain electrode portions 3*a* and 4*a* and a distance (channel length L) between the source electrode portion 3*a* and the drain electrode portion 4*a* to be relatively small, and accordingly it is possible to acquire a thin film transistor 1 that has a low absolute value of threshold voltage and a high driving current, that is, a thin film transistor having an excellent characteristic as a switching element can be acquired.

Alternatively, the source electrode 3 and the drain electrode 4 may be formed by using a lift-off method. In other words, a resist mask having an opening corresponding to the form of the source and the drain electrodes 3 and 4 is formed on a substrate 2 and the substrate 2 on which the resist mask is formed is dipped in a plating solution, thereby a plating film corresponding to the form of the source and drain electrodes 3 and 4 is formed. Thereafter, the resist mask is peeled off, and thereby the source and the drain electrodes 3 and 4 can be acquired.

Figure 3B:
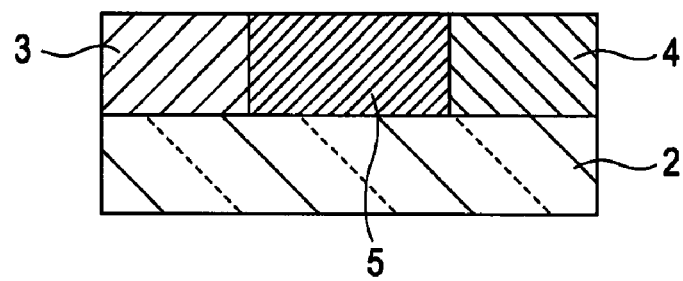

Next, as shown in FIG. 3B, an organic semiconductor layer 5 is formed on the substrate 2 on which the source electrode 3 and the drain electrode 4 are formed.

The organic semiconductor layer 5, for example, can be formed by coating (supplying) a solution containing an organic polymer material or a precursor thereof so as to cover the source electrode 3 and the drain electrode 4 on the substrate 2 by using a coating method and performing appropriate post-processing (for example, heating, infrared ray radiation, or ultrasonic wave application) as is needed. Here, as the coating method, for example, a spin coating method, a casting method, a micro gravure coating method, a gravure coating method, a bar coating method, a roll coating method, a wire bar coating method, a dip coating method, a spray coating method, a screen printing method, a flexo printing method, an offset printing method, an ink-jet printing method, or a micro contact printing method may be used. The coating process may be performed by using one of such coating methods described above or any combination of two or more thereof.

Among such methods, it is preferable to use the ink-jet method for forming the organic semiconductor layer 5. By using the ink-jet method, it is possible to form the organic semiconductor layer 5 only on the channel area without forming a resist mask. Accordingly, it is possible to decrease a usage amount of the organic semiconductor material and to reduce the production cost of the thin film transistor. In addition, by using the ink-jet method, a photo resist, a chemical agent such as a developing solution or a film-peeling solution, or a plasma process such as an oxygen plasma process or a $CF_4$ plasma process is not required. Thus, there is no problem that the characteristics of the organic semiconductor material are changed (for example, is doped) or deteriorated. An area for forming the organic semiconductor layer 5 is not limited to that shown in the figure, and the organic semiconductor layer 5 may be formed so as to cover the source electrode portion 3*a* and the drain electrode portion 4*a*.

As a solvent for dissolving the organic semiconductor material, for example, an inorganic solvent such as nitric acid, sulfuric acid, ammonia, hydrogen peroxide, water, carbon disulfide, carbon tetrachloride, or ethylene carbonate, an organic solvent including: a ketone solvent such as methyl ethyl ketone (MEK), acetone, diethyl ketone, methyl isobutyl ketone (MIBK), methyl isopropyl ketone (MIPK), or cyclohexanone; an alcohol solvent such as methanol, ethanol, isopropanol, ethylene glycol or diethylene glycol (DEG), or glycerin; an ether solvent such as diethyl ether, diisopropyl ether, 1,2-dimethoxyethane (DME), 1,4-dioxane, tetrahydrofuran (THF), tetrahydropyran (THP), anisole, diethylene glycol dimethyl ether (diglyme), or diethylene glycol ethyl ether (carbitol); a cellosolve based solvent such as methylcellosolve, ethylcellosolve, or phenylcellosolve; an aliphatic hydrocarbon based solvent such as hexan, pentane, heptane, or cyclohexan; an aromatic hydrocarbon based solvent such as toluene, xylene, or benzene; a heteroaromatic compound based solvent such as pyridine, pyrazine, furan, pyrrole, thiophene, or methyl pyrrolidone; an amide based solvent such as N,N-dimethylformamide (DMF) or N,N-dimethylacetamide (DMA); a halogen compound-based solvent such as dichloromethane, chloroform, or 1,2-dichloroethane; an ester based solvent such as ethyl acetate, methyl acetate, or ethyl formate; a sulfur compound-based solvent such as dimethyl sulfoxide (DMSO) or sulfolane; or a nitrile based solvent such as acetonitrile, propionitrile, or acrylonitrile; an organic acid-based solvent such as formic acid, acetic acid, trichloroacetic acid, or trifluoroacetic acid, or a mixed solvent containing a number of the above-described solvents may be used.

Since the organic semiconductor material includes a conjugate system such as an aromatic hydrocarbon radical or a heterocyclic group, it is easily dissolved by an aromatic hydrocarbon solvent. Toluene, xylene, trimethylbenzene, tetramethylbenzene, cyclohexylbenzene, or the like is a particularly appropriate solvent for the organic semiconductor material.

Figure 3C:
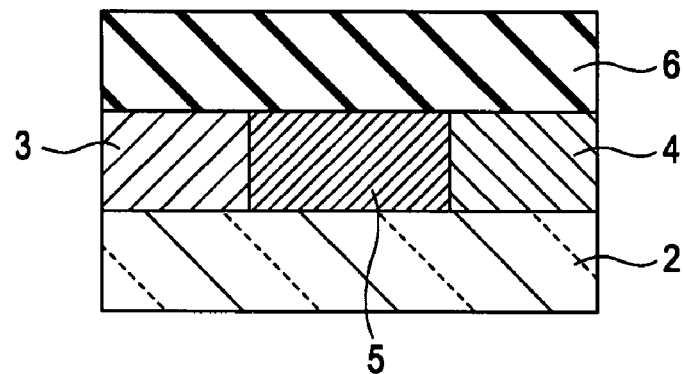

Next, as shown in FIG. 3C, a gate insulating layer 6 is formed so as to, at least, cover the organic semiconductor layer 5. The gate insulating layer 6, for example, can be formed by coating (supplying) the organic semiconductor layer 5 with a solution containing an insulating material or a precursor thereof using a coating method and performing appropriate post-processing (for example, heating, infrared ray radiation, or ultrasonic wave application) for the coated film as is needed. Alternatively, the gate insulating lay 6 may be formed by using the ink-jet method.

As the coating method, the above-described method can be used. As described above, since the organic semiconductor material can be easily dissolved by an aromatic hydrocarbon solvent, it is desirable to suppress dissolution of the organic semiconductor material when the insulating material is coated. Thus, it is preferable to use a water-based solvent, an alcohol solvent, a ketone solvent, an ether solvent, an ester solvent, an aliphatic hydrocarbon solvent, or a fluorinated solvent.

Figure 3D:
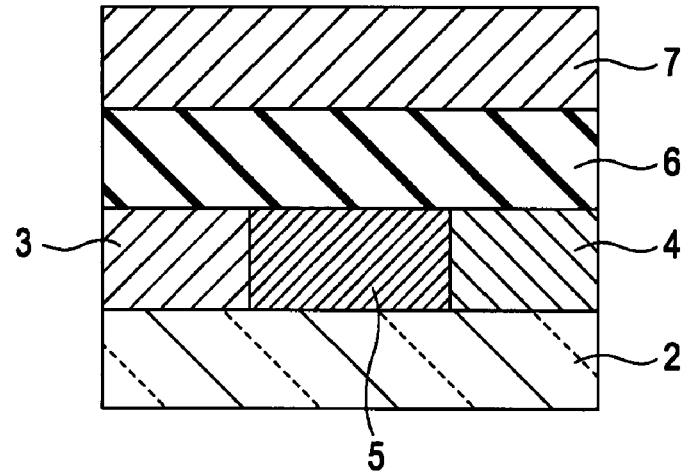

Next, as shown in FIG. 3D, a gate line 7 is formed on the gate insulating layer 6. As the method of forming the gate line 7, an ink-jet method in which a liquid material containing conductive particles or the above-described lift-off method can be used. Alternatively, the gate line 7 may be formed by forming a resist mask using lithography technology after formation of a conduction film and etching the conduction film using the resist mask.

As described above, the thin film transistor 1 shown in FIG. 2 can be acquired.

Advantages of the thin film transistor according to the above-described embodiment will now be described. In the embodiment, a plurality of the gate lines 7 are disposed, and thereby a plurality of independent channels are induced in the organic semiconductor layer 5 between the source electrode 3 and the drain electrode 4.

As a result, for example, when the organic semiconductor layer 5 below a gate line 7a shown in FIG. 1 is deteriorated to be changed in properties due to repetitive application of voltages to the gate line 7a, other gate lines 7b and 7c can be used so as to induce channels in areas on the organic semiconductor layer 5 different from that of the gate line 7a. Accordingly, a normal operation of the thin film transistor which has a characteristic close to an initial characteristic thereof can be performed, and it is possible to improve durability and reliability of the thin film transistor 1.

Figure 4A:
FIGS. 4A and 4B are diagrams illustrating a method of driving the thin film transistor.
Figure 4B:
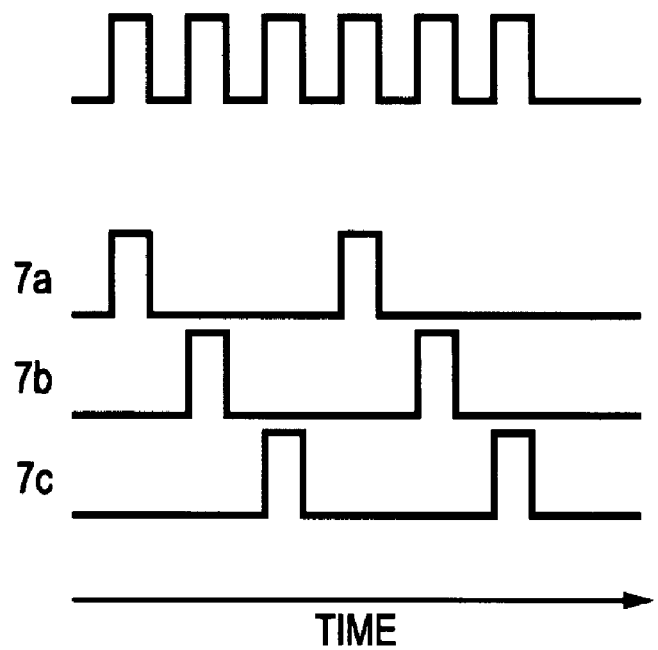

Furthermore, since the organic semiconductor layer 5 is gradually deteriorated as the application of the voltage is repeated, it is possible to delay the deterioration due to operations with equivalent switching operation being maintained by using the plurality of gate lines 7 alternately. As an example, it is assumed that a required switching characteristic can be acquired by applying a driving pulse shown in FIG. 4A to the gate lines 7. In such a case, the same characteristic as the required switching characteristic can be acquired by applying driving pulses of frequency shown in FIG. 4B to the gate lines 7a, 7b, and 7c, in the embodiment. In other words, for example, by turning on/off n gate lines 7 one by one, a unit driving time per one gate line 7 can be set to 1/n. If the unit driving time can be reduced, it is possible to suppress the deterioration of the organic semiconductor layer 5, whereby it is possible to improve durability and reliability of the thin film transistor 1.

Furthermore, for example, when a defect occurs in a partial area of the organic semiconductor layer 5 during a production process thereof, a gate line 7 that induces a channel in an area other than the defective area can be used. Accordingly, the whole thin film transistor 1 becoming defective due to a defect of the partial area of the organic semiconductor layer 5 can be prevented.

A driving current of the transistor is inversely proportional to the square of a channel length and is proportional to the mobility of carriers. Thus, the channel length L may be shortened so as to increase the driving current of the thin film transistor 1. In the embodiment, since the channel length L per one channel is shortened by dividing the organic semiconductor layer 5 into a plurality of the source electrodes 3 (electrode portions 3a) and a plurality of drain electrodes 4 (electrode portions 4a), it is possible to increase the driving current of the thin film transistor 1.

The driving current of the transistor is also proportional to a channel width thereof. In the embodiment, when a gate voltage is applied to one gate line 7, a plurality of channels are induced along an extending direction of the gate line 7. As a result, since a channel width of the whole transistor is "gate width W×number N of distances (gaps) between the electrode portions 3a and the electrode portions 4a", an advantage that the channel width substantially increases is obtained. Consequently, the driving current of the thin film transistor 1 can increase.

Second Embodiment

Figure 5:
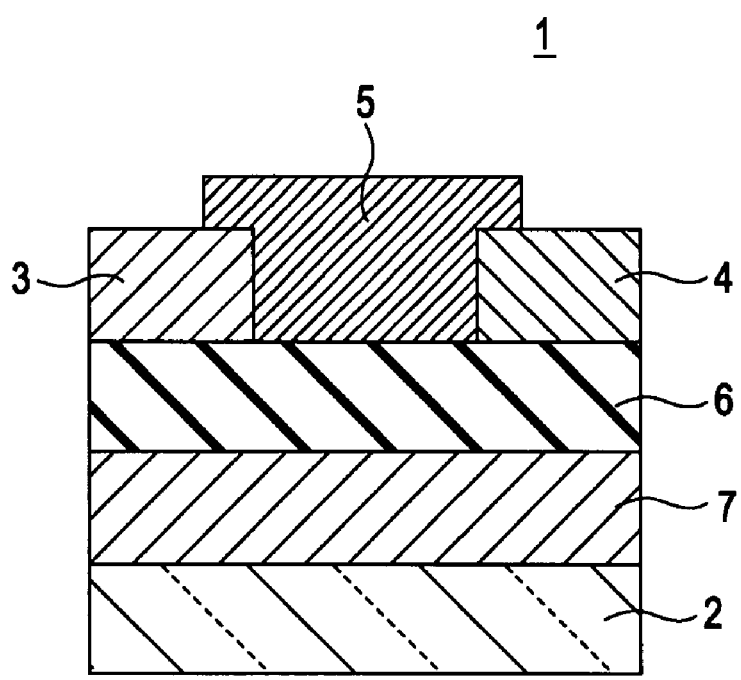
FIG. 5 is a sectional view of a thin film transistor according to a second embodiment of the invention.

FIG. 5 is a sectional view of a thin film transistor 1 according to a second embodiment of the invention.

As shown in FIG. 5, the thin film transistor 1 includes gate lines 7 formed on a substrate 2, a gate insulating layer 6 formed on the gate lines 7, a source electrode 3 and a drain electrode 4 which are formed on the gate insulating layer 6, and an organic semiconductor layer 5 that is provided between the source electrode 3 and the drain electrode 4.

The thin film transistor 1 has a structure in which the gate lines 7 are provided on a substrate 2 side relative to the organic semiconductor layer 5, that is, a bottom-gate structure. As described above, the thin film transistor 1 whose structure is a bottom-gate type can be used.

Third Embodiment

Figure 6:
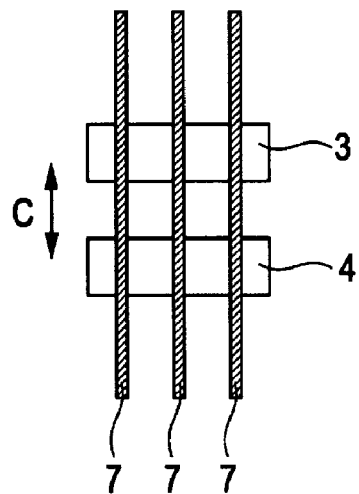
FIG. 6 is a plan view of a thin film transistor according to a third embodiment of the invention.

FIG. 6 is a plan view of a thin film transistor 1 according to a third embodiment of the invention.

As shown in FIG. 6, both a source electrode 3 and a drain electrode 4 are formed in the shape of an approximate rectangle and extend along a longitudinal direction of a channel C. In addition, three gate lines 7 extend in a direction perpendicular to the longitudinal direction of the channel C.

As described above, the thin film transistor 1 that has a simple structure including a general source electrode 3 and a general drain electrode 4 other than the comb-teeth-like shaped source and drain electrodes 3 and 4 can be used. In such a case, since a plurality of independent channels can be induced between the source electrode 3 and the drain electrode 4, it is possible to improve durability and reliability of the thin film transistor 1, as in the first embodiment.

Fourth Embodiment

Figure 7:
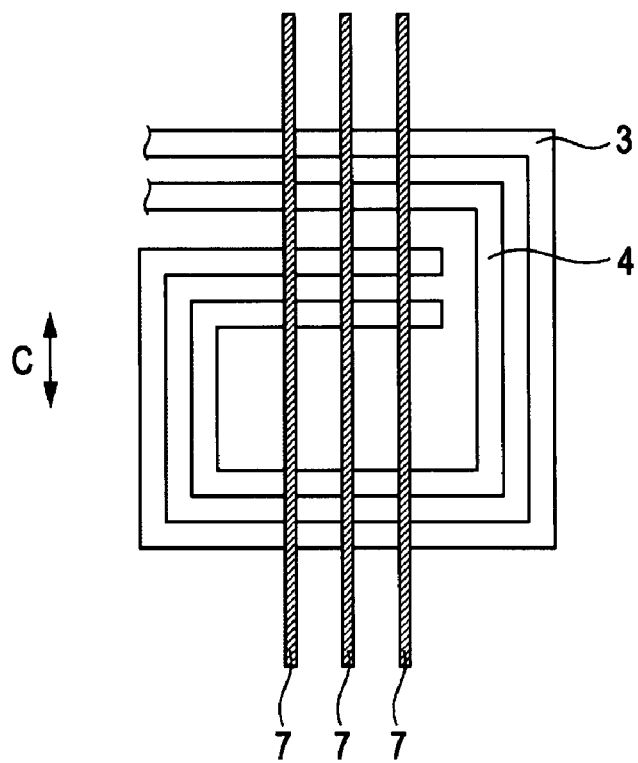
FIG. 7 is a plan view of a thin film transistor according to a fourth embodiment of the invention.

FIG. 7 is a plan view of a thin film transistor 1 according to a fourth embodiment of the invention.

As shown in FIG. 7, a source electrode 3 and a drain electrode 4 which face each other intersect gate lines 7 several times. To be more specific, the source electrode 3 and the drain electrode 4 are formed in the shape of a spiral.

Accordingly, a plurality of channels having short channel lengths are induced for each gate line 7, whereby the driving current of the thin film transistor can be increased.

The shape of the source and drain electrodes 3 and 4 is not limited to the comb-teeth-like shape or the spiral shape, and the source and drain electrodes 3 and 4 may have a shape in which channels can be divided along the gate lines. To be more specific, a plurality of pairs of the source and drain electrodes 3 and 4 that face each other are to be provided along an extending direction of the gate lines 7.

Fifth Embodiment

Figure 8:
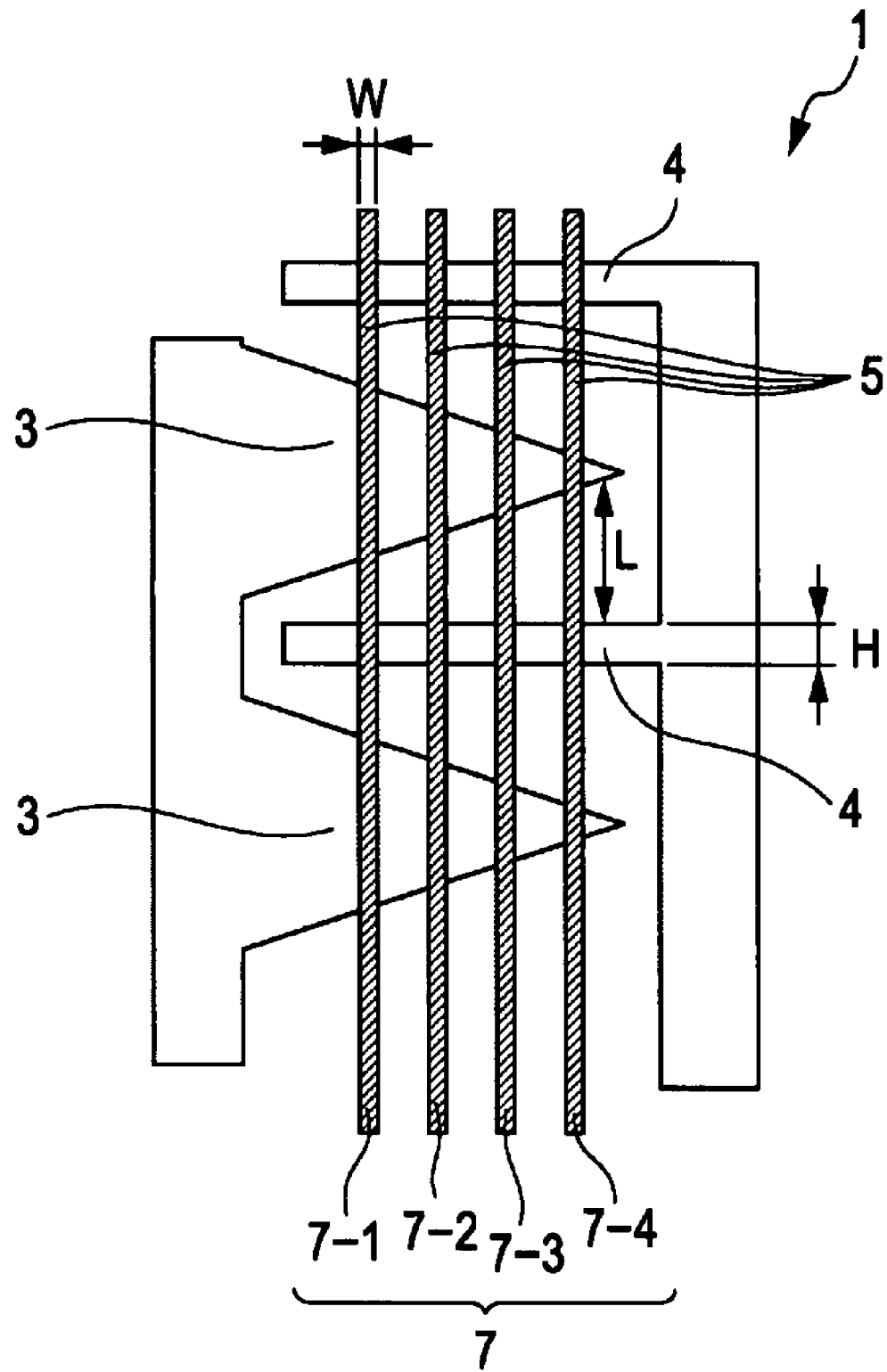
FIG. 8 is a plan view of a thin film transistor according to a fifth embodiment of the invention.

FIG. 8 is a plan view of a thin film transistor according to a fifth embodiment of the invention. FIG. 8 shows the positional relationship among gate lines 7, source electrodes 3, and drain electrodes 4 of one thin film transistor.

As shown in FIG. 8, the thin film transistor 1 according to the embodiment includes a plurality of the gate lines 7. In FIG. 8, although a case where four gate lines 7-1, 7-2, 7-3, and 7-4 are disposed is shown, the number of the gate lines is not limited to four. Hereinafter, when individual gate lines 7-1, 7-2, 7-3, and 7-4 are not required to be identified, they will be simply referred to as gate lines 7. Each gate line 7 extends over the source electrodes 3 and the drain electrodes 4. In addition, organic semiconductor layers 5 are provided on an under layer of the gate lines 7 between the source electrodes 3 and the drain electrodes 4 with a gate insulating layer 6 (FIG. 2) being interposed therebetween.

The source electrodes 3 and the drain electrode 4 are disposed to be insulated from the gate lines 7. In this embodiment, a plane shape (pattern shape) of each source electrode 3 is formed to be a taper. Accordingly, gaps L between the source electrodes 3 and the drain electrodes 4 in portions in which the source and drain electrodes are overlapped with the gate lines 7 are different for each gate line 7. To be more specific, gaps between the source electrodes 3 and the drain electrodes 4 are the smallest in a gate line 7-1 side and are the largest in a gate line 7-4 side. Alternatively, the drain electrodes 4 may be formed in the shape of a taper, and both of the source electrodes 3 and the drain electrodes 4 may be formed in the shape of a taper.

Although two source electrodes 3 that are protrusions in the shape of a taper are provided in FIG. 8, the present invention is not limited thereto, and any plural source electrodes may be used. The number of the drain electrodes is determined in correspondence with the number of the source electrodes 3.

A channel length induced in a case where a gate voltage is applied to the gate line 7 is influenced by the gap L between the source electrode 3 and the drain electrode 4. In other words, as the gap between the source electrode 3 and the drain electrode 4 becomes large, the corresponding channel length becomes large. The driving current of the transistor is in inverse proportion to the square of the channel length. Accordingly, in a case where a value of the gate voltage is the same, when the gate voltage is applied to the gate line 7-1, the largest driving current can be acquired. On the other hand, when the gate voltage is applied to the gate line 7-4, the smallest driving current can be acquired.

In this embodiment, the source electrodes 3 and the drain electrodes 4 are disposed alternately in an extending direction of the gate lines 7, and the whole electrodes are in the shape of comb-teeth. Thus, the total channel width of one transistor is the channel width W multiplied by the number n of the gate lines 7. Accordingly, the same effect as in a case where the channel width is increased can be acquired, whereby the driving current of the transistor can be increased.

The gap L between the source electrode 3 and the drain electrode 4 is preferably in the range of approximate 2 to 20 μm and is more preferably in the range of 3 to 10 μm. The smaller becomes the gap L, the larger driving current (drain current) can be controlled. However, when the gap L becomes smaller than the above-described lower limit, photolithographic technology for electrode patterning with high precision is required, thereby a production cost thereof is increased. Furthermore, even when a small gap L is formed, there are cases where an expected effect cannot be acquired due to contact resistance between the source electrode and the organic semiconductor layer. On the other hand, when the gap L becomes larger than the upper limit, the value of the driving current decreases, whereby there is a possibility that the characteristic of the thin film transistor 1 becomes insufficient.

When the thin film transistor 1 is in an OFF state in which a voltage value is not applied to the gate lines 7, even if a voltage value is applied between the source electrode 3 and the drain electrode 4, carriers scarcely exist in the organic semiconductor layer 5, whereby a current scarcely flows. On the other hand, when the thin film transistor 1 is in an ON state in which a voltage value exceeding a threshold value is applied to the gate lines 7, carriers are induced in a portion of the organic semiconductor layer 5 facing the gate insulating layer 6, whereby a channel is formed. When a voltage value is applied between the source electrode 3 and the drain electrode 4 in this status, a current flows through this channel. The driving current is in inverse proportion to the square of the channel length. Accordingly, in a case where a value of the gate voltage is the same, when the gate voltage is applied to the gate line 7-1, the largest driving current can be acquired. On the other hand, when the gate voltage is applied to the gate line 7-4, the smallest driving current can be acquired.

An advantage of the thin film transistor according to this embodiment will now be described.

In the thin film transistor according to this embodiment, even when the same gate voltage is applied to the gate lines, plural types (in this example, four types) of driving currents can be acquired by selection of the gate lines 7-1 to 7-4.

In other words, even when the same gate voltage is applied to the gate lines 7, the driving current can be controlled by selection of the gate lines 7, by disposing a plurality of the gate lines 7 and changing the gaps between the source electrodes 3 and the drain electrodes 4 for each gate line 7. As a result, the driving current can be controlled by selection of the gate lines 7 without changing the gate voltage value.

In addition, like a general transistor, the current amount flowing between the source electrodes 3 and the drain electrodes 4 can be controlled by changing a voltage value applied to the gate lines 7.

Furthermore, in a case where an organic thin film transistor is used, the following advantages can be acquired. When the thin film transistor according to this embodiment is used, a gate line 7 generating a driving current closest to a driving current appropriate for its use is selected and the gate voltage is controlled as is required, whereby a required driving current can be acquired. Thus, when n gate lines 7 are provided, if simply averaged, the unit driving time for one gate line 7 can be reduced to 1/n. As a result, the deterioration of the organic semiconductor layer 5 right below the gate lines 7 can be suppressed, whereby it is possible to improve durability and reliability of the thin film transistor 1.

Sixth Embodiment

Figure 9:
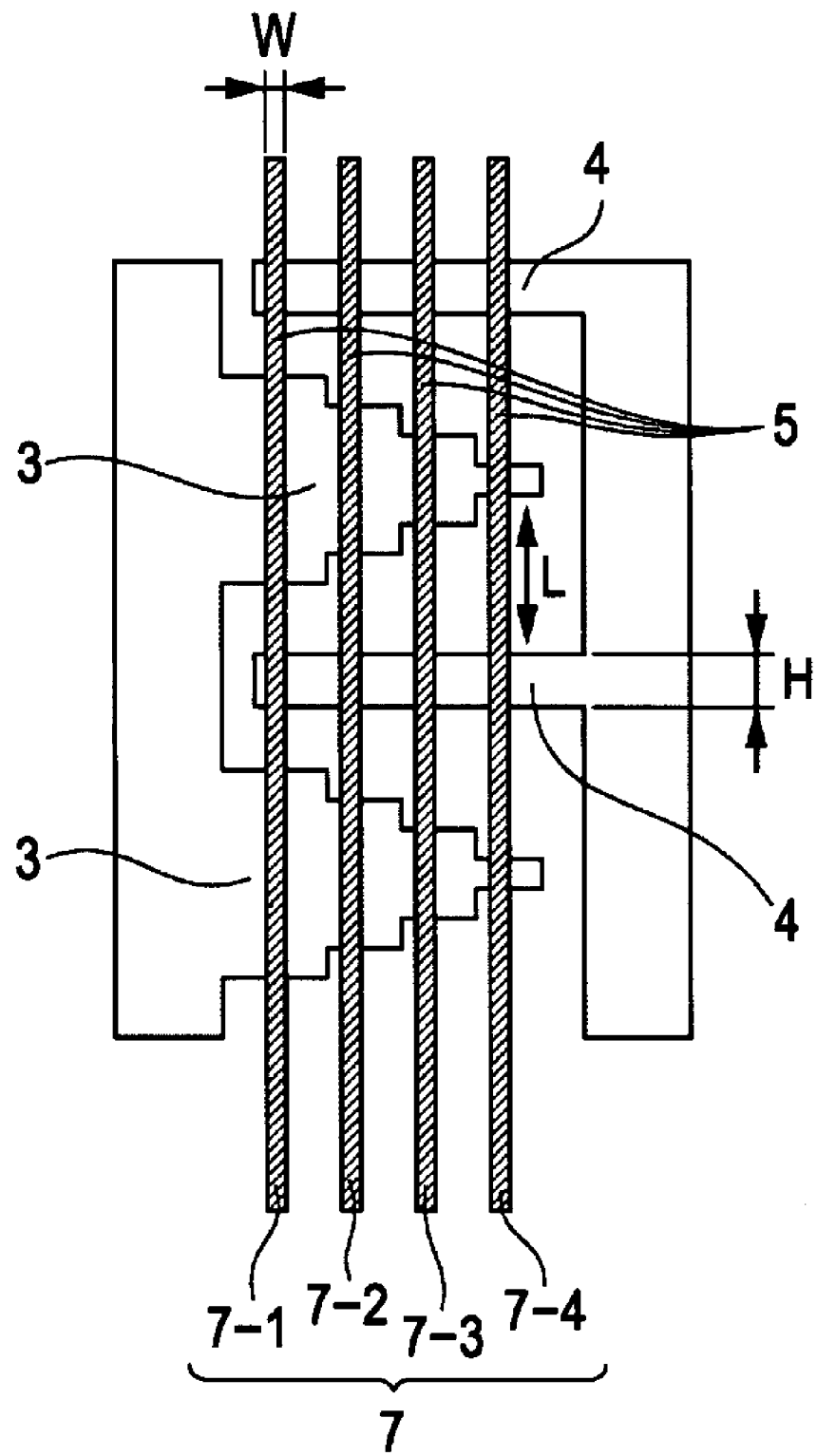
FIG. 9 is a plan view of a thin film transistor according to a sixth embodiment of the invention.

FIG. 9 is a plan view of a thin film transistor 1 according to a sixth embodiment of the invention.

As shown in FIG. 9, a source electrode 3 of the thin film transistor 1 according to this embodiment is in the plane shape of a step. Thus, gaps L between source electrodes 3 and drain electrodes 4 in portions in which the source and drain electrodes 3 and 4 and gate lines 7 are overlapped with each other are different for each gate line 7. To be more specific, the gap between the source electrode 3 and the drain electrode 4 is the smallest in a gate line 7-1 side and is the largest in a gate line 7-4 side. Alternatively, the drain electrode 4 may be formed in the shape of a step, and both the source electrode 3 and the drain electrode 4 may be formed in the shape of a step.

Thus, when the thin film transistor 1 according to the sixth embodiment is used, the driving current can be controlled by selection of the gate lines 7.

In this embodiment, the source electrodes 3 are in the shape of a step, and sides of the shape of the step intersecting the gate lines 7 are parallel to a side of the source electrodes 3. Thus, even when the gate lines 7 are formed to be slightly deviated to the right/left side due to a non-uniform production process thereof or the like, the gaps between the source electrode 3 and the drain electrode 4 are not influenced thereby, and accordingly, it is possible to suppress variation of the driving current due to positional deviation of the gate lines 7.

In other words, according to the second embodiment, the thin film transistor 1, which is capable of absorbing the non-uniformity in a production process and has a structure producible in an easy manner, having advantages of the first embodiment can be provided. Since the thin film transistor can absorb the non-uniformity in a production process, a fabrication yield thereof is increased, and accordingly, it is possible to produce the thin film transistor 1 at low cost.

Seventh Embodiment

Figure 10:
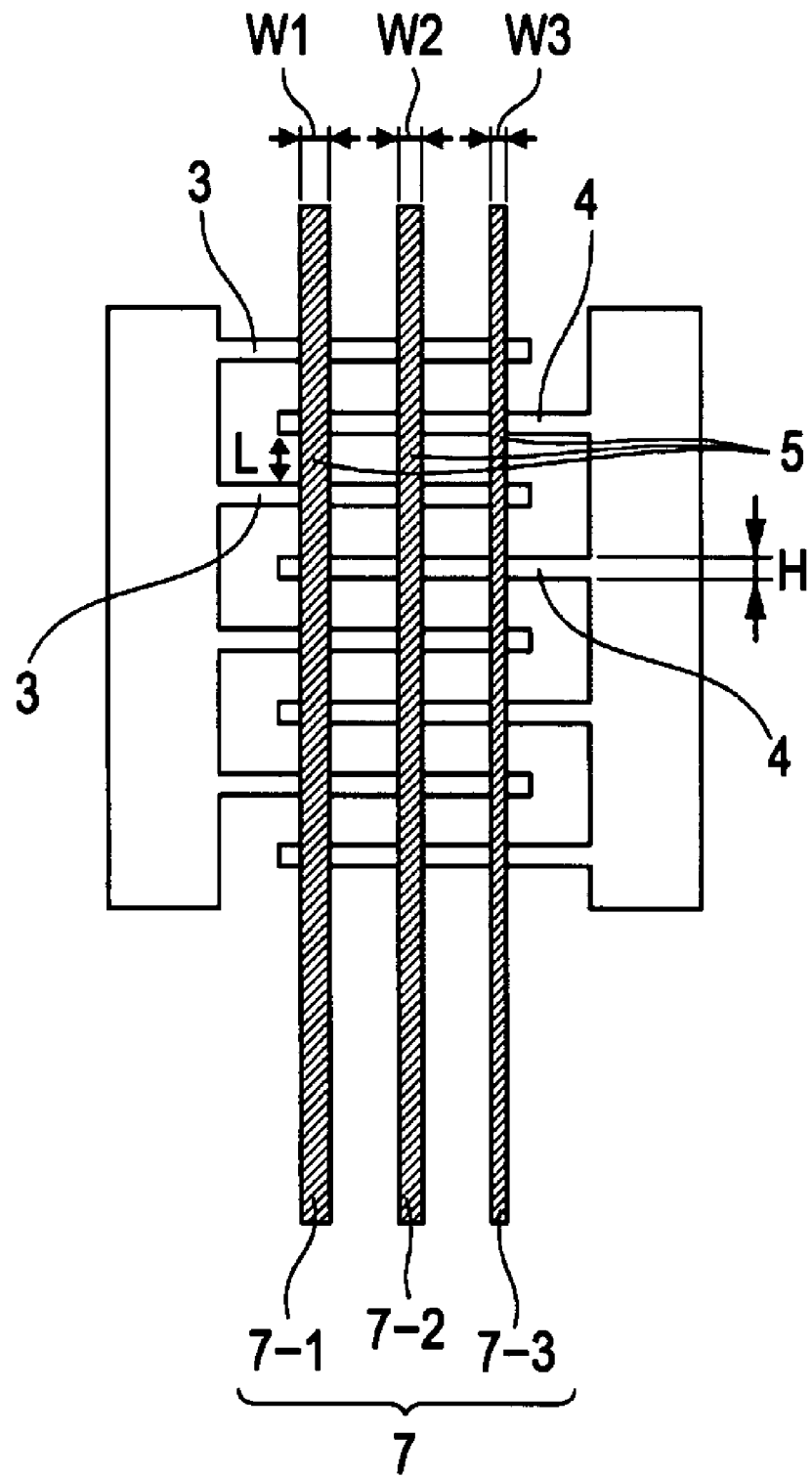
FIG. 10 is a plan view of a thin film transistor according to a seventh embodiment of the invention.

FIG. 10 is a plan view of a thin film transistor 1 according to a seventh embodiment of the invention.

As shown in FIG. 10, widths (gate widths) of gate lines 7 of the thin film transistor 1 according to this embodiment are different for each gate line 7. To be more specific, it is set to be W1>W2>W3, wherein W1, W2, and W3 are gate widths of gate lines 7-1, 7-2, and 7-3. In an extending direction of the gate lines 7, source and drain electrodes 3 and 4 in a rectangular shape are arranged alternately.

The width H of the electrodes 3 and 4 is preferably equal to or less than 20 μm and is more preferably in the range of several μm to 10 μm.

The driving current of the transistor is in proportion to the width of the gate. Thus, in a case where a value of the gate voltage is the same, the largest driving current can be acquired when the gate line 7-1 is selected. On the other hand, the least driving current can be acquired when the gate line 7-3 is selected. As described above, in the thin film transistor 1 according to the seventh embodiment, a driving current can be controlled by selection of the gate lines 7. In addition, since the source electrode 3 and the drain electrode 4 are disposed to be parallel to each other, it is possible to suppress variation of the driving current due to positional deviation of the gate lines 7.

Consequently, the same advantages as in the sixth embodiment can be acquired in the thin film transistor 1 according to the seventh embodiment.

Eighth Embodiment

Figure 11:
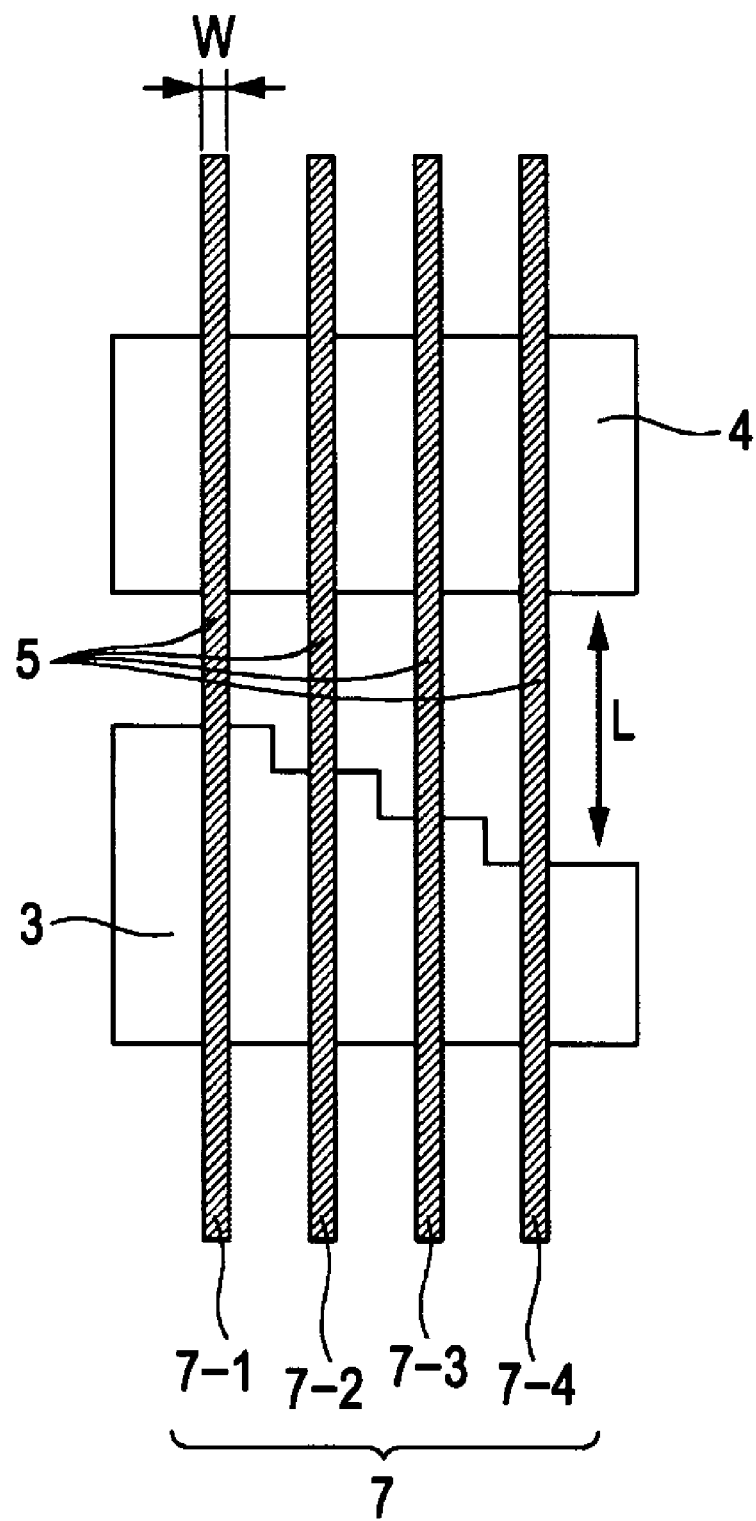
FIG. 11 is a plan view of a thin film transistor according to an eighth embodiment of the invention.

FIG. 11 is a plan view of a thin film transistor 1 according to an eight embodiment of the invention.

As shown in FIG. 11, one pair of source electrode 3 and drain electrode 4, other than the source and drain electrodes 3 and 4 in the shape of comb-teeth, is formed along an extending direction of gate lines 7. In this embodiment, a side of an outer edge of the source electrode 3 which faces the drain electrode 4 is formed to be in the shape of a step. Thus, gaps between the source electrode 3 and the drain electrode 4 are different for each gate line 7. Alternatively, the drain electrodes 4 may be formed to be in the shape of a step.

By using this structure, even when the gate lines 7 are formed to be slightly deviated to the right/left side, the gaps between the source electrode 3 and the drain electrode 4 are not influenced thereby.

Consequently, the same advantages as in the second embodiment can be acquired in the thin film transistor 1 according to the fourth embodiment.

As described above, the thin film transistor 1 that has a simple structure including a general source electrode 3 and a general drain electrode 4 other than the comb-teeth-like shaped source and drain electrodes 3 and 4 can be used. Even in such as a case, the driving current can be controlled by selection of the gate lines 7.

Electro-Optical Device

Figure 12:
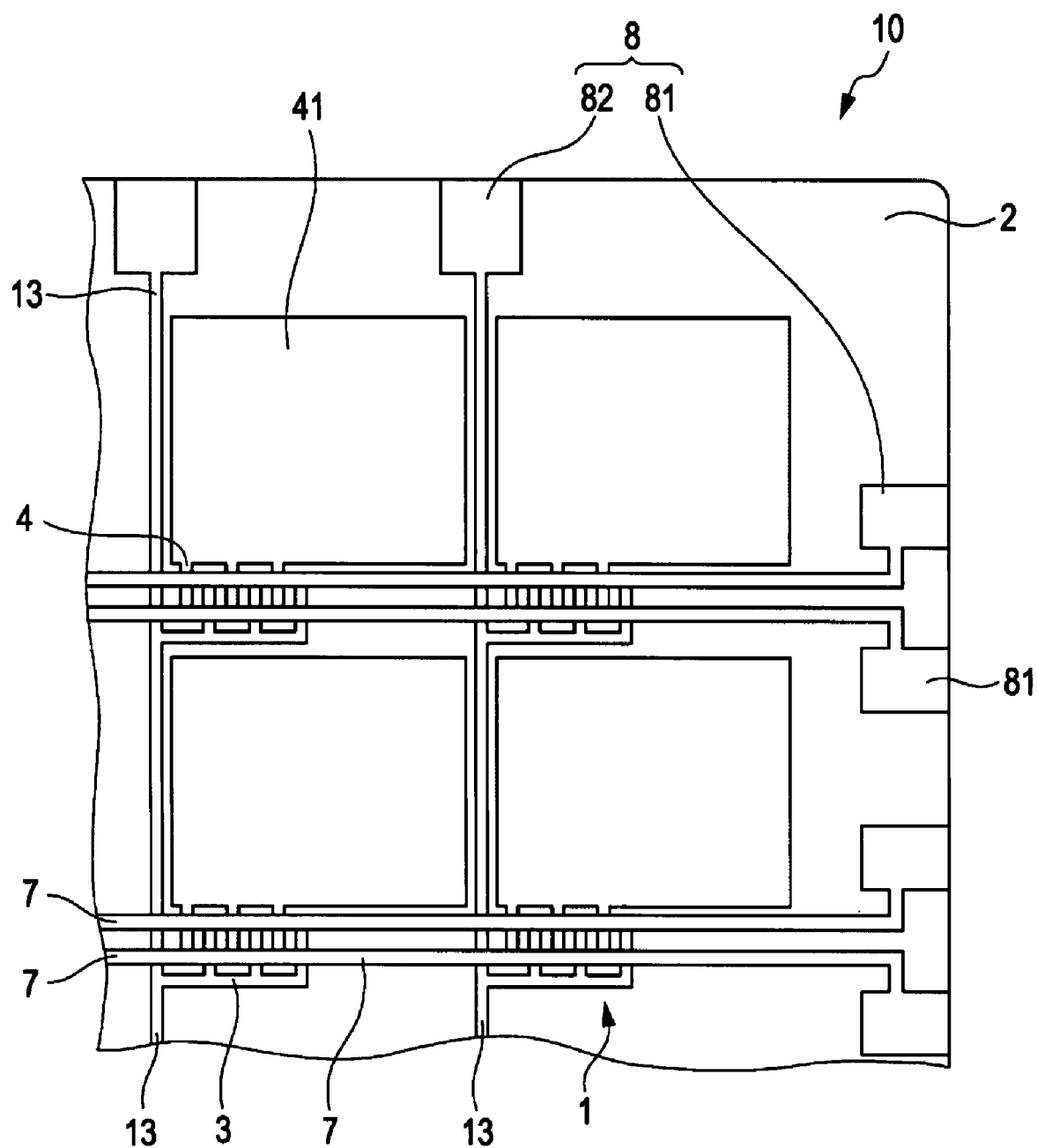
FIG. 12 is a plan view of an electro-optical device according to an embodiment of the invention, as an example.

FIG. 12 is a diagram showing a wiring substrate of an electro-optical device according to an embodiment of the invention. The wiring substrate of the electro-optical device has a plurality of the above-described thin film transistors 1.

The wiring substrate 10 shown in FIG. 12 includes a substrate 2, thin film transistors 1 provided on the substrate 2, pixel electrodes 41, connection terminals 8, source lines 13, and gate lines 7.

The pixel electrodes 41 are used for constituting one electrode for applying voltage to pixels when an electronic-optical device is built by using the wiring substrate 10. The pixel electrodes 41 are arranged in the form of a matrix.

To each one of the pixel electrodes 41, a drain electrode 4 of the thin film transistor 1 arranged in the form of a matrix is connected. Thus, driving operations of the pixels of the electro-optical device can be controlled by controlling operations of the thin film transistors 1.

The connection terminals 8 have a plurality of first terminals 81 and a plurality of second terminals 82. The first terminals 81 and the second terminals 82 constitute terminals for connecting to driving ICs.

The gate lines 7 are commonly connected to the thin film transistors 1 arranged in a column direction. In this embodiment, a case where two gate lines 7 are disposed for each thin film transistor 1 is shown. One ends of the gate lines 7 are connected to the first terminals 81.

The source lines 13 are commonly connected to the source electrodes 3 of the thin film transistors 1 arranged in a row direction. The source lines 13 are formed simultaneously with the source electrodes 3. One ends of the source lines 13 are connected to the second terminals.

As a material of the pixel electrodes 41, connection terminals 8 (first terminals 81 and second terminals 82), or the source lines 13, any material having conductivity can be used. However, for example, the same material as the above-described material used for the source electrode 3 and the drain electrode 4 can be used. Accordingly, the source electrodes 3, the drain electrodes 4, the pixel electrodes 41, the connection terminals 8, and the source lines 13 can be formed simultaneously, Besides the above-described materials, as the material of the gate lines 7, the materials used for the source electrode 3 and the drain electrode 4 may be used.

Hereinafter, an electrophoretic display device as an electro-optical device including the above-described wiring substrate 10 will be described as an example.

Figure 13:
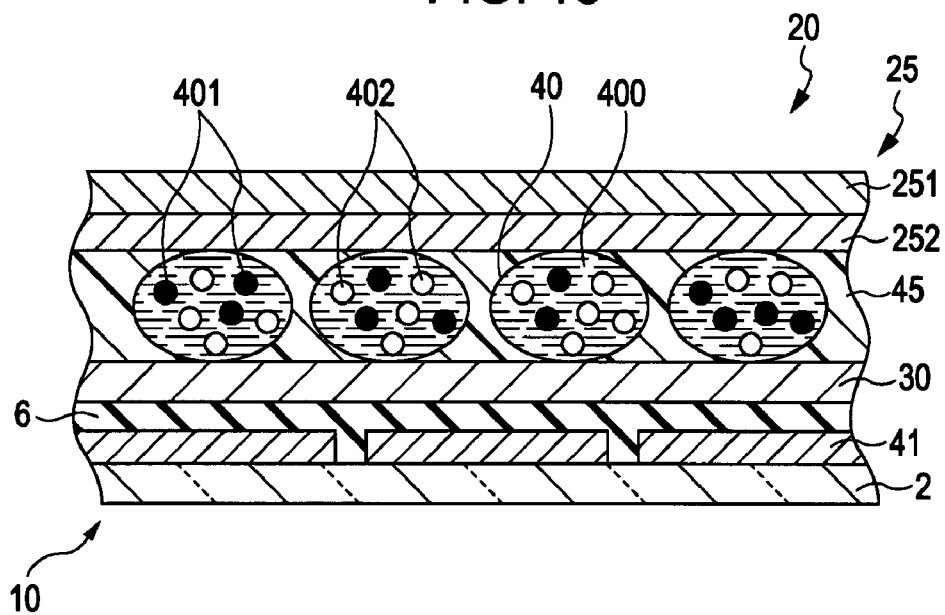
FIG. 13 is a sectional view of an electro-optical device according to an embodiment of the invention, as an example.

FIG. 13 is a longitudinal sectional view showing an electrophoretic display device in which the wiring substrate 10 according to an embodiment of the invention is used.

The electrophoretic display device 20 shown in FIG. 13 includes a wiring substrate 10 and an electrophoretic display unit 25 provided on the wiring substrate 10. As shown in FIG. 13, the electrophoretic display unit 25 includes an opposing substrate 251, an opposing electrode 252, microcapsules 40, and a binding material 45. On the opposing substrate 251, the opposing electrode 252 is laminated, and the microcapsules 40 (display media) are fixed on the opposing electrode 252 by the biding material 45.

The pixel electrodes 41 are disposed in a matrix form, are connected to a drain electrode 4 of a thin film transistor 1, and are covered with a gate insulating layer 6. The electrophoretic display unit 25 and the wiring substrate 10 are bonded together through a protection film 30.

The protection film 30 serves to protect the thin film transistor 1 in a mechanical manner and, to be described later, prevent diffusion of a lipophilic liquid to a wiring substrate 10 side. Inside each capsule 40, an electrophoretic dispersion liquid 400 containing plural types of electrophoretic particles having different characteristics, in this embodiment, containing two types of electrophoretic particles 401 and 402 having different electric charges and colors (hue) is sealed.

To connection terminals 8 (terminals 81 and 82) of the wiring substrate 10, a terminal of a driving IC is connected, thereby it is possible to shift the thin film transistor 1 (switching element) on the wiring substrate 10 between ON/OFF states. In other words, in the electrophoretic display device 20, when a selection signal (selection voltage) is supplied to one or more gate lines 7, a thin film transistors 1 connected to the gate line 7 to which this selection signal (selection voltage) is supplied becomes the ON state.

Accordingly, a source line 13 and a pixel electrode 41 which are connected to the thin-film transistor 1 are electrically conducted. In this case, when desired data (voltage) is supplied to the source line 13, the data (voltage) is supplied to the pixel electrode 41. Thus, an electric field is generated between the pixel electrode 41 and the opposing electrode 252, whereby the electrophoretic particles 401 and 402 are subjected to electrophoresis in a direction of one between the electrodes in accordance with the direction and intensity of the electric field, characteristics of the electrophoretic particles 401 and 402, and the like.

On the other hand, when the supply of the selection signal (selection voltage) to the gate line 7 is stopped in this state, the thin-film transistor 1 becomes the OFF state, whereby the source line 13 and the pixel electrode 41 which are connected to the thin film transistor 1 become non-conductive. Thus, a desired image (information) can be displayed on a display side (opposing substrate) of the electrophoretic display device 20 by appropriately combining the supply and stop of a selection signal for the gate line 7 or the supply or stop of data for the source line 13.

Since the electrophoretic display device 20 according to this embodiment uses the wiring substrate 10 having the thin film transistor 1 according to an embodiment of the invention, it is possible to improve the durability and reliability of the electrophoretic display device 20.

An electro-optical device according to an embodiment of the invention is not limited to the electrophoretic display device 20 and may be a liquid crystal display device, an organic or inorganic EL display device, or the like.

Electronic Apparatus

The electro-optical device such as the above-described electrophoretic display device 20 may be installed to various electronic apparatuses. As an example of the electronic apparatus, an electronic paper will now be described.

Figure 14:
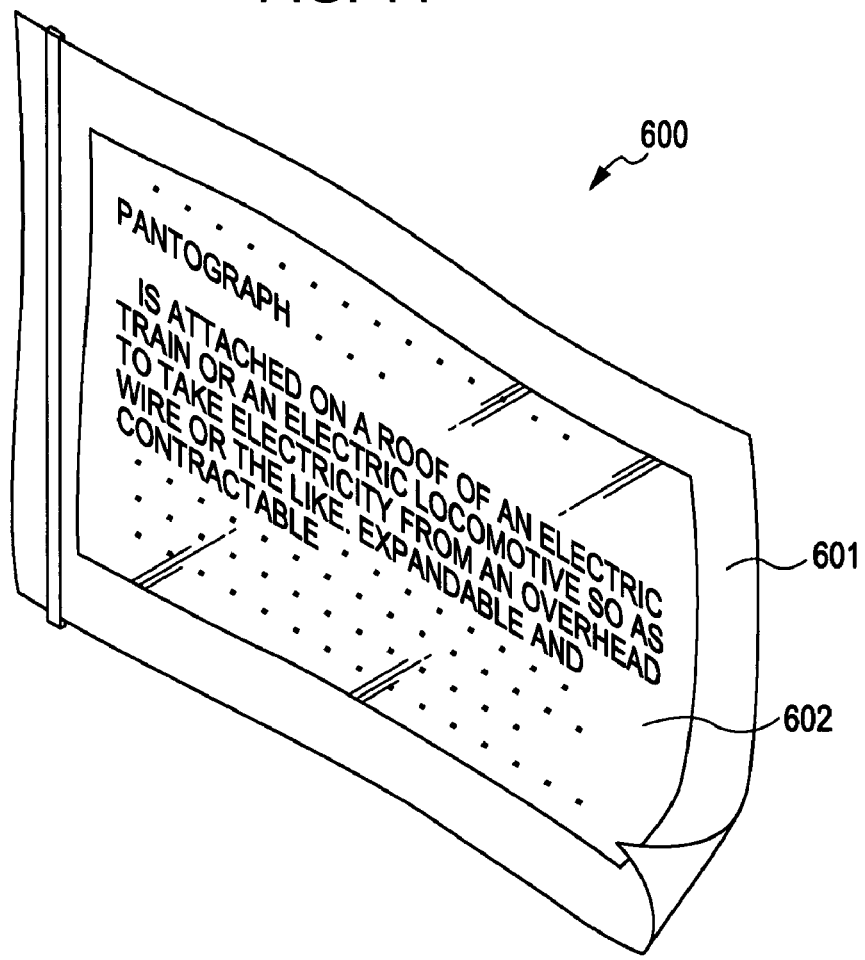
FIG. 14 is a perspective view of an electronic apparatus according to an embodiment of the invention.

FIG. 14 is a perspective view of an electronic paper.

The electronic paper 600 shown in FIG. 14 includes a main body 601 formed of a rewritable sheet having the same texture and flexibility as paper and a display unit 602. The display unit 602 of this electronic paper 600 includes the above-described electrophoretic display device 20.

The electronic apparatus according to an embodiment of the invention is not limited to the above-described apparatuses. The electronic apparatus, for example, includes a television set, a viewfinder-type or monitor direct view-type video cassette recorder, a car navigator, a pager, an electronic diary, a calculator, an electronic newspaper, a word processor, a personal computer, a workstation, a video phone, a POS terminal, an apparatus having a touch panel, or the like. An electro-optical device having the thin film transistor 1 according to the embodiment can be used in display units of these various electronic apparatuses.

Although, a thin film transistor, an electro-optical device, and an electronic apparatus according to embodiments of the invention have been described, the present invention is not limited thereto.

Therefore, various changes may be made therein without departing from the gist of the invention.

What is claimed:

1. A thin film transistor comprising:
   a source electrode and a drain electrode which are disposed to face each other;
   an organic semiconductor layer provided at least between the source electrode and the drain electrode;
   a plurality of gate lines extending over the source electrode, the organic semiconductor layer, and the drain electrode; and
   a gate insulating layer interposed between the source electrode, the drain electrode, and the organic semiconductor layer and the plurality of gate lines,
   wherein each one of the plurality of gate lines is electrically isolated from all other of the plurality of gate lines, and
   wherein, in plan view, gap lengths between the source electrode and the drain electrode in portions where the plurality of gate lines overlap the source electrode and the drain electrode are different for each gate line of the plurality of gate lines.

2. The thin film transistor according to claim 1, wherein the source electrode comprises a plurality of source electrodes portions and the drain electrode comprises a plurality of drain electrodes portions, and wherein the plurality of source electrode portions and the plurality of drain electrode portions are disposed alternately along an extending direction of the plurality of gate lines, and wherein the plurality of gate lines intersect the plurality of the source electrodes portions and the plurality of drain electrodes portions.

3. The thin film transistor according to claim 1, wherein the source electrode and the drain electrode are formed in a comb-teeth-like shape.

4. The thin film transistor according to claim 1, wherein, in plan view, at least one of the source electrode and the drain electrode is formed in a taper-like or a step-like plane shape.

5. The thin film transistor according to claim 1, wherein widths of the plurality of gate lines are different for each gate line.

6. An electro-optical device having the thin film transistor according to claim 1.

7. An electronic apparatus having the electro-optical device according to claim 6.

8. The thin film transistor according to claim 1, further configured to receive a voltage to induce a conductive channel between the source electrode and the drain electrode, the voltage only being applied to one of the plurality of gate lines at a time.

* * * * *